(12) United States Patent
Huang et al.

(10) Patent No.: US 12,320,846 B2
(45) Date of Patent: Jun. 3, 2025

(54) ELECTRONIC DEVICE AND METHOD FOR PERFORMING CLOCK GATING IN ELECTRONIC DEVICE

(71) Applicant: Realtek Semiconductor Corp., HsinChu (TW)

(72) Inventors: Ching-Feng Huang, HsinChu (TW); Yu-Cheng Lo, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 18/376,001

(22) Filed: Oct. 3, 2023

(65) Prior Publication Data

US 2024/0110976 A1   Apr. 4, 2024

(30) Foreign Application Priority Data

Oct. 4, 2022   (TW) .................................. 111137697

(51) Int. Cl.
  *G01R 31/317*   (2006.01)
(52) U.S. Cl.
  CPC . *G01R 31/31727* (2013.01); *G01R 31/31721* (2013.01); *G01R 31/31725* (2013.01)
(58) Field of Classification Search
  CPC ........ G01R 31/31727; G01R 31/31721; G01R 31/31725

USPC ......................................................... 714/731
See application file for complete search history.

(56) References Cited

U.S. PATENT DOCUMENTS

| | | | |
|---|---|---|---|
| 6,938,225 B2* | 8/2005 | Kundu | G01R 31/318541 714/727 |
| 10,685,730 B1* | 6/2020 | Shah | G01R 31/3187 |
| 2003/0146777 A1 | 8/2003 | Nadeau-Dostie | |
| 2013/0117618 A1* | 5/2013 | Kukreja | G01R 31/318552 714/E11.148 |
| 2014/0164860 A1* | 6/2014 | Kim | G01R 31/318536 714/731 |
| 2016/0169966 A1* | 6/2016 | Abshishek | G01R 31/318541 714/727 |

* cited by examiner

*Primary Examiner* — James C Kerveros
(74) *Attorney, Agent, or Firm* — Winston Hsu

(57) ABSTRACT

An electronic device and a method for performing clock gating in the electronic device are provided. The electronic device includes at least one function circuit, a device under test (DUT) circuit and at least one gating circuit. The function circuit is configured to operate according to at least one primary clock, and the DUT circuit is configured to operate according to at least one secondary clock. In addition, the clock gating circuit is configured to control whether to enable the primary clock according to at least one primary enable signal, and control whether to enable the secondary clock according to the primary enable signal and a secondary enable signal.

14 Claims, 4 Drawing Sheets

ELECTRONIC DEVICE AND METHOD FOR PERFORMING CLOCK GATING IN ELECTRONIC DEVICE

BACKGROUND OF THE INVENTION

1. Field of the Invention

The present invention is related to clock gating, and more particularly, to an electronic device and a method for performing clock gating in the electronic device.

2. Description of the Prior Art

According to low power operation requirements, chips are typically equipped with clock switch circuits for controlling whether to enable corresponding low power circuits. In the related art, when a device under test (DUT) circuit is being tested, the low power circuit mentioned above needs to be enabled in order to transfer required clock signals to the DUT circuit. Thus, even when a chip has a low power control design which allows the low power circuit to be disabled in a low power mode, the low power circuit still needs to be enabled when testing the DUT circuit, thereby introducing additional power consumption.

Thus, there is a need for a novel method and associated architecture to allow a chip to be able to test a DUT circuit when operating in low power mode.

SUMMARY OF THE INVENTION

An objective of the present invention is to provide an electronic device and a method for performing clock gating in the electronic device, to solve the problem of the related art without introducing any side effect or in a way that is less likely to introduce side effects.

At least one embodiment of the present invention provides an electronic device. The electronic device comprises at least one function circuit, a device under test (DUT) circuit and at least one gating circuit. The at least one function circuit is configured to operate according to at least one primary clock, and the DUT circuit is configured to operate according to at least one secondary clock. In addition, the at least one gating circuit is configured to control whether to enable the at least one primary clock according to at least one primary enable signal, and control whether to enable the at least one secondary clock according to the at least one primary enable signal and a secondary enable signal.

At least one embodiment of the present invention provides a method for performing clock gating in an electronic device. The method comprises: utilizing at least one function circuit of the electronic device to operate according to at least one primary clock; utilizing a DUT circuit of the electronic device to operate according to at least one secondary clock; and utilizing at least one gating circuit of the electronic device to control whether to enable the at least one primary clock according to at least one primary enable signal and control whether to enable the at least one secondary clock according to the at least one primary enable signal and a secondary enable signal.

The electronic device and the method provided by the embodiment of the present invention utilize a gating circuit to perform logic operations upon the primary enable signal and the secondary enable signal, in order to generate both the primary clock required by the function circuit and the secondary clock required by the DUT circuit. As the operations of the gating circuit can individually control the primary clock and the secondary (e.g. can maintain an operation of the secondary clock when the primary clock is disabled), the DUT circuit can be tested under a condition where the electronic device operates in a power saving mode (e.g. a condition where an operation of the function circuit is stopped).

These and other objectives of the present invention will no doubt become obvious to those of ordinary skill in the art after reading the following detailed description of the preferred embodiment that is illustrated in the various figures and drawings.

DETAILED DESCRIPTION

Figure 1:
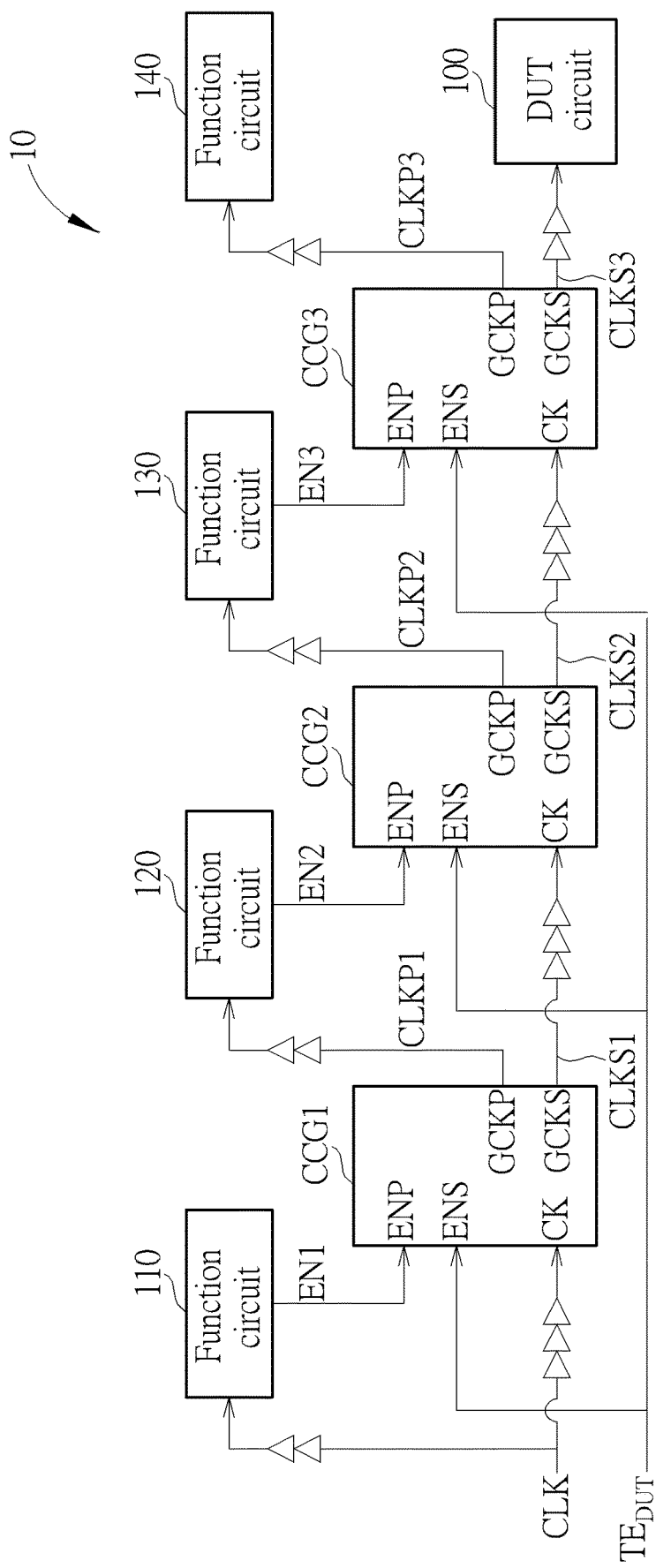
FIG. 1 is a diagram illustrating an electronic device according to an embodiment of the present invention.

FIG. 1 is a diagram illustrating an electronic device 10 according to an embodiment of the present invention. In this embodiment, the electronic device 10 may comprise at least one function circuit (e.g. function circuits 110, 120, 130 and 140), a device under test (DUT) circuit 100 and at least one gating circuit (e.g. combo clock gated circuits CCG1, CCG2 and CCG3), where the at least one function circuit may be configured to operate according to at least one primary clock (e.g. primary clocks CLKP1, CLKP2 and CLKP3), and the DUT circuit 100 may be configured to operate according to at least one secondary clock (e.g. secondary clocks CLKS1, CLKS2 and CLKS3). In addition, the at least one gating circuit may be configured to control whether to enable the at least one primary clock according to at least one primary enable signal (e.g. primary enable signal EN1, EN2 and EN3), and control whether to enable the at least one secondary clock according to the at least one primary enable signal and a secondary enable signal $TE_{DUT}$. For example, the function circuit 110 may operate according to a system clock CLK, the function circuit 120 may operate according to the primary clock CLKP1, the function circuit 130 may operate according to the primary clock CLKP2, the function circuit 140 may operate according to the primary clock CLKP3, and the DUT circuit 100 may operate according to the secondary clock CLKS3.

In this embodiment, the system clock is maintained at an enabled state after the electronic device 10 is powered on, and the function circuit 110 therefore outputs the primary enable signal EN1 according to an operation mode of the electronic device 10. The combo clock gated circuit CCG1 may receive the primary enable signal EN1 from the function circuit 110, where the combo clock gated circuit CCG1 may control whether to enable the primary clock CLKP1 according to the primary enable signal EN1, and control whether to enable the secondary clock CLKS1 according to the primary enable signal EN1 and the secondary enable signal $TE_{DUT}$. For example, the combo clock gated circuit CCG1 may perform gating upon the system clock CLK according to the primary enable signal EN1 and the secondary enable signal $TE_{DUT}$ to output the primary clock CLKP1 to the function circuit 120 and output the secondary clock CLKS1 to the combo clock gated circuit CCG2, and the function circuit 120 may output the primary enable signal EN2 according to the operation mode of the electronic device 10. The combo clock gated circuit CCG2 may receive the primary enable signal EN2 from the function circuit 120, where the combo clock gated circuit CCG2 may control whether to enable the primary clock CLKP2 according to the primary enable signal EN2, and control whether to enable the secondary clock CLKS2 according to the primary enable signal EN2 and the secondary enable signal $TE_{DUT}$. For example, the combo clock gated circuit CCG2 may perform gating upon the secondary clock CLKS1 according to the primary enable signal EN2 and the secondary enable signal $TE_{DUT}$ to output the primary clock CLKP2 to the function circuit 130 and output the secondary clock CLKS2 to the combo clock gated circuit CCG3, and the function circuit 130 may output the primary enable signal EN3 according to the operation mode of the electronic device 10.

The combo clock gated circuit CCG3 may receive the primary enable signal EN3 from the function circuit 130, where the combo clock gated circuit CCG3 may control whether to enable the primary clock CLKP3 according to the primary enable signal EN3, and control whether to enable the secondary clock CLKS3 according to the primary enable signal EN3 and the secondary enable signal $TE_{DUT}$. For example, the combo clock gated circuit CCG3 may perform gating upon the secondary clock CLKS2 according to the primary enable signal EN3 and the secondary enable signal $TE_{DUT}$ to output the primary clock CLKP3 to the function circuit 140 and output the secondary clock CLKS3 to the DUT circuit 100.

For any combo clock gated circuit of the combo clock gated circuits CCG1, CCG2 and CCG3, a terminal for receiving the at least one primary enable signal (e.g. the primary enable signal EN1, EN2 or EN3) is labeled "ENP" (which may be referred to as the input terminal ENP) in FIG. 1, a terminal for receiving the secondary enable signal $TE_{DUT}$ is labeled "ENS" (which may be referred to as the input terminal ENS) in FIG. 1, a terminal for receiving an input clock (e.g. the system clock CLK, the secondary clock CLKS1 or the secondary clock CLKS2) is labeled "CK" (which may be referred to as the input terminal CK) in FIG. 1, a terminal for outputting the at least one primary clock (e.g. the primary clocks CLKP1, CLKP2 or CLKP3) is labeled "GCKP" (which may be referred to as the output terminal GCKP) in FIG. 1, and a terminal for outputting the at least one secondary clock (e.g. the secondary clocks CLKS1, CLKS2 or CLKS3) is labeled "GCKS" (which may be referred to as the output terminal GCKS) in FIG. 1. In addition, any (e.g. each) of the system clock CLK, the primary clocks CLKP1, CLKP2 and CLKP3, and the secondary clocks CLKS1, CLKS2 and CLKS3 may be transferred via one or more stages of buffers, where a stage number of the one or more stages of buffers may vary according to practical requirements.

In this embodiment, the primary enable signals EN1, EN2 and/or EN3 may correspond to the operation mode of the electronic device 10. For example, when a power saving mode of the electronic device 10 is turned off, the primary enable signals EN1, EN2 and/or EN3 may have a first logic value (e.g. a logic value "1"); and when the power saving mode of the electronic device 10 is turned on, the primary enable signals EN1, EN2 and/or EN3 may have a second logic value (e.g. a logic value "0"); but the present invention is not limited thereto. In addition, the secondary enable signal $TE_{DUT}$ may correspond to a test mode of the DUT circuit 100. For example, when the secondary enable signal $TE_{DUT}$ has a first logic value (e.g. the logic value "1"), the test mode of the DUT circuit 100 may be turned on; and when the secondary enable signal $TE_{DUT}$ has a second logic value (e.g. the logic value "0"), the test mode of the DUT circuit 100 may be turned off, but the present invention is not limited thereto.

In this embodiment, when the primary enable signals EN1, EN2 and/or EN3 indicate that the power saving mode of the electronic device 10 is turned off (e.g. when the primary enable signals EN1, EN2 and/or EN3 have the logic value "1"), the combo clock gated circuit CCG1 may enable the primary clock CLKP1 and the secondary clock CLKS1, the combo clock gated circuit CCG2 may enable the primary clock CLKP2 and the secondary clock CLKS2, and the combo clock gated circuit CCG3 may enable the primary clock CLKP3 and the secondary clock CLKS3.

In this embodiment, when the primary enable signals EN1, EN2 and/or EN3 indicate that the power saving mode of the electronic device 10 is turned on (e.g. when the primary enable signals EN1, EN2 and/or EN3 have the logic value "0"), the combo clock gated circuit CCG1 may disable the primary clock CLKP1 to stop an operation of the function circuit 120, the combo clock gated circuit CCG2 may disable the primary clock CLKP2 to stop an operation of the function circuit 130, and the combo clock gated circuit CCG3 may disable the primary clock CLKP3 to stop an operation of the function circuit 140.

In this embodiment, when the primary enable signals EN1, EN2 and/or EN3 indicate that the power saving mode of the electronic device 10 is turned on and the secondary enable signal $TE_{DUT}$ indicates that the test mode of the DUT circuit 100 is turned on (e.g. when the primary enable signals EN1, EN2 and/or EN3 have the logic value "0" and the secondary enable signal $TE_{DUT}$ has the logic value "1"), the combo clock gated circuit CCG1 may disable the primary clock CLKP1 to stop an operation of the function circuit 120, the combo clock gated circuit CCG2 may disable the primary clock CLKP2 to stop an operation of the function circuit 130, and the combo clock gated circuit CCG3 may disable the primary clock CLKP3 to stop an operation of the function circuit 140, where the combo clock gated circuit CCG1 may enable the secondary clock CLKS1, the combo clock gated circuit CCG2 may enable the secondary clock CLKS2, and the combo clock gated circuit CCG3 may enable the secondary clock CLKS3, in order to maintain an operation of the DUT circuit 100 under a condition where the power saving mode of the electronic device is turned on.

Figure 2:
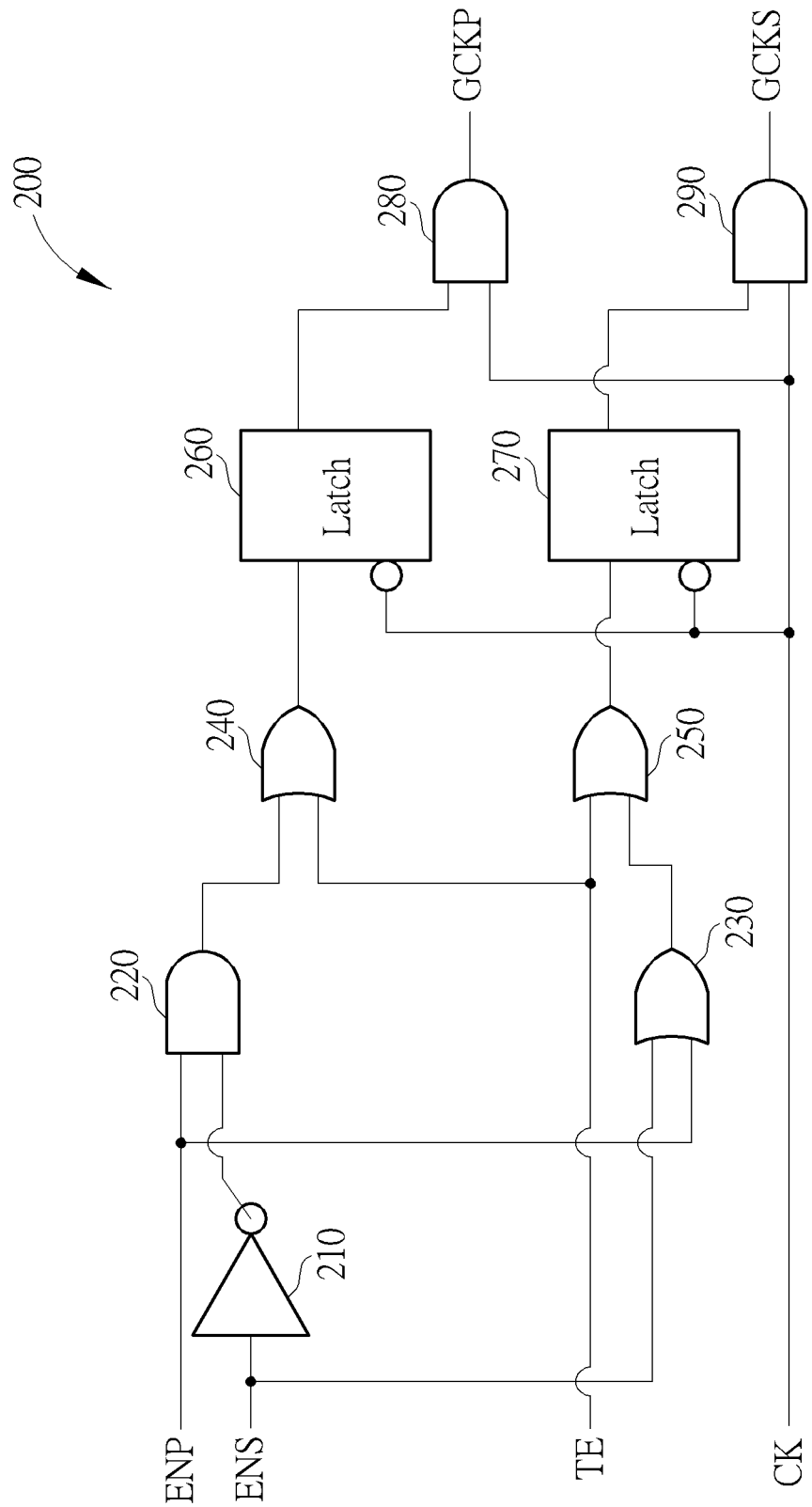
FIG. 2 is a diagram illustrating implementation details of a combo clock gated circuit according to an embodiment of the present invention.

FIG. 2 is a diagram illustrating implementation details of a combo clock gating circuit 200 according to an embodiment of the present invention, where the combo clock gated circuit 200 may be an example of any (e.g. each) of the combo clock gated circuits CCG1, CCG2 and CCG3 shown in FIG. 1. It should be noted that, in addition to the input terminals ENP, ENS and CK and the output terminals GCKP and GCKS, the combo clock gated circuit 200 may further comprise an input terminal TE configured to receive an enable signal of a scan mode of the electronic device 10, where the scan mode of the electronic device 10 may be configured to check whether each of the sub-circuits is able to receive available clocks (e.g. checking whether the system clock CLK is mistakenly blocked by the combo clock gated circuits CCG1, CCG2 and CCG3, thereby making any of the secondary clocks CLKS1, CLKS2 and CLS3 unable to be properly enabled). In this embodiment, the enable signal received by the input terminal TE may be fixed at the logic value "0" (i.e. the scan mode of the electronic device 10 is turned off). As the scan mode of the electronic device 10 is not the focus of the present invention, and does not affect the implementation of the present invention, related details are omitted here for brevity.

As shown in FIG. 2, the combo clock gated circuit 200 may comprise an inverter 210, an AND gate 220, OR gates 230, 240 and 250, latches 260 and 270, and AND gates 280 and 290. In this embodiment, an input terminal of the inverter 210 is coupled to the input terminal ENS of the combo clock gated circuit 200, where the inverter 210 may be configured to generate an inverted signal of the secondary enable signal $TE_{DUT}$. Two input terminals of the AND gate 220 are respectively coupled to the input terminal ENP of the combo clock gated circuit 100 and an output terminal of the inverter 210, where the AND gate 220 may be configured to perform an AND logic operation upon the at least one primary enable signal (e.g. the primary enable signals EN1, EN2 or EN3) and the inverter signal of the secondary enable signal $TE_{DUT}$ to generate a primary clock control signal, where the at least one primary clock (e.g. the primary clocks CLKP1, CLKP2 or CLKP3) may be generated according to the primary clock control signal. For example, two input terminals of the OR gate 240 are respectively coupled to an output terminal of the AND gate 220 and the input terminal TE of the combo clock gated circuit 200, a data input terminal of the latch 260 is coupled to an output terminal of the OR gate 240, two input terminals of the AND gate 280 are respectively coupled to a data output terminal of the latch 260 and the input terminal CK of the combo clock gated circuit 200, and an output terminal of the AND gate 280 is coupled to the output terminal GCKP of the combo clock gated circuit 200. Thus, the AND gate 280 may perform an AND logic operation upon a clock signal received by the input terminal CK of the combo clock gated circuit 200 (e.g. the system clock CLK, the secondary clock CLKS1 or the secondary clock CLKS2) and a derivative signal of the primary clock control signal (e.g. a signal generated by the OR gate 240 and the latch 260 performing logic operations upon the primary clock control signal output from the AND gate 220) to generate the at least one primary clock, where the latch 260 may latch data output from the OR gate 240 according to timing of an inverted signal of the clock signal received by the input terminal CK (which is illustrated by a circle depicted on the latch 260 in FIG. 2).

In addition, two input terminals of the OR gate 230 are respectively coupled to the input terminals ENP and ENS, where the OR gate 230 may be configured to perform an OR logic operation upon the at least one primary enable signal (e.g. the primary enable signals EN1, EN2 or EN3) and the secondary enable signal $TE_{DUT}$ to generate a secondary clock control signal, where the at least one secondary clock (e.g. the secondary clocks CLKS1, CLKS2 or CLKS3) may be generated according to the secondary clock control signal. For example, two input terminals of the OR gate 250 are respectively coupled to an output terminal of the OR gate 230 and the input terminal TE of the combo clock gated circuit 200, a data input terminal of the latch 270 is coupled to an output terminal of the OR gate 250, two input terminals of the AND gate 290 are respectively coupled to a data output terminal of the latch 270 and the input terminal CK of the combo clock gated circuit 200, and an output terminal of the AND gate 290 is coupled to the output terminal GCKS of the combo clock gated circuit 200. Thus, the AND gate 290 may perform an AND logic operation upon the clock signal received by the input terminal of the combo clock gated circuit 200 (e.g. the system clock CLK, the secondary clock CLKS1 or the secondary clock CLKS2) and a derivative signal of the secondary clock control signal (e.g. a signal generated by the OR gate 250 and the latch 270 performing a logic operations upon the secondary clock control signal output from the AND gate 230) to generate the at least one secondary clock, where the latch 270 may latch data output from the OR gate 250 according to the timing of the inverted signal of the clock signal received by the input terminal CK (which is illustrated by a circle depicted on the latch 270 in FIG. 2).

Figure 3:
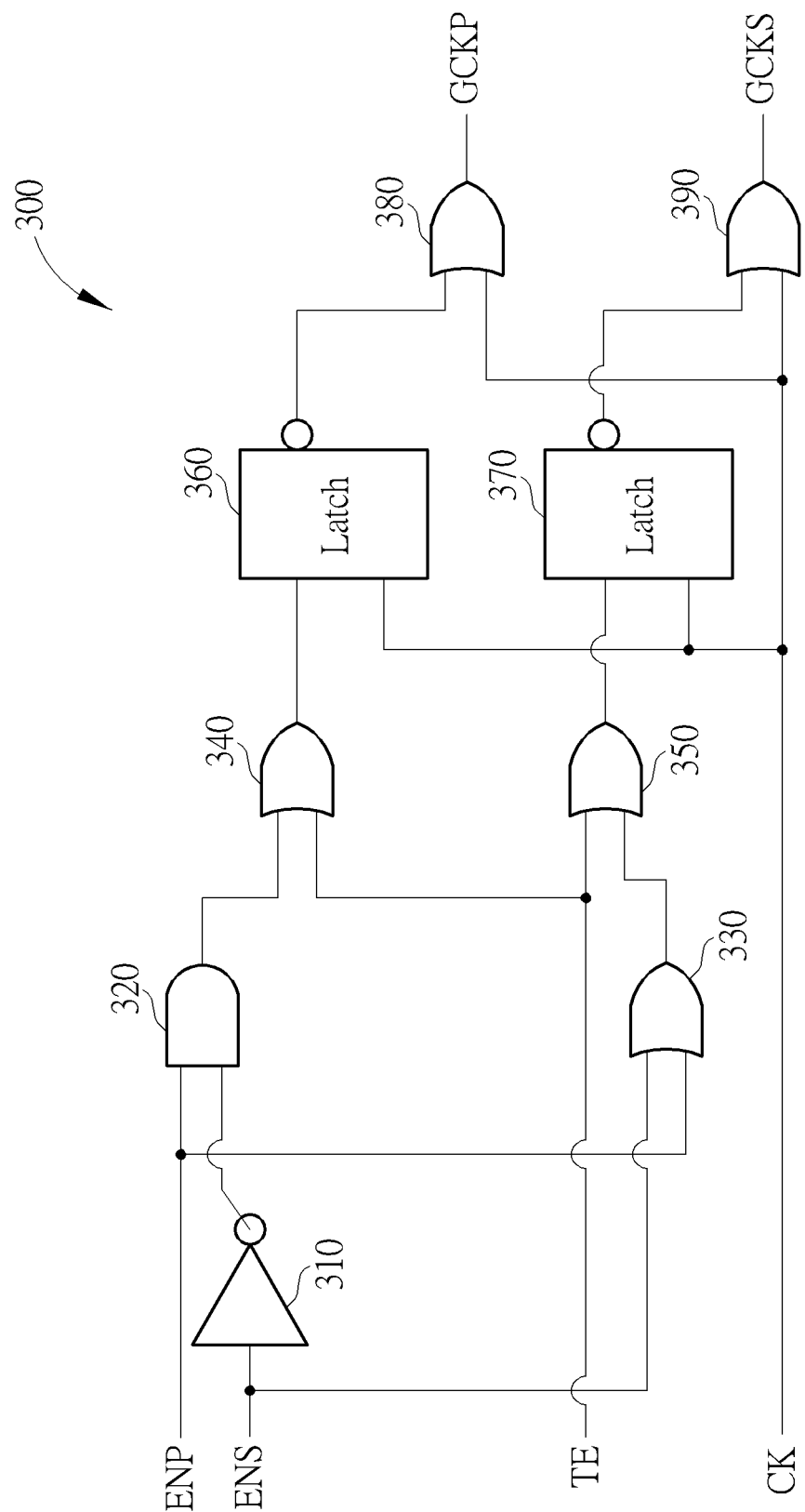
FIG. 3 is a diagram illustrating implementation details of a combo clock gated circuit according to another embodiment of the present invention.

FIG. 3 is a diagram illustrating implementation details of a combo clock gating circuit 300 according to another embodiment of the present invention, where the combo clock gated circuit 300 may be an example of any (e.g. each) of the combo clock gated circuits CCG1, CCG2 and CCG3 shown in FIG. 1. Similar to the combo clock gated circuit 200, the combo clock gated circuit 300 also comprises the input terminals ENP, ENS and CK, the output terminals GCKP and GCKS, and the input terminal TE. For brevity, related details are not repeated here. In this embodiment, the enable signal received by the input terminal TE may be fixed at the logic value "0" (i.e. the scan mode of the electronic device 10 is turned off).

As shown in FIG. 3, the combo clock gated circuit 300 may comprise an inverter 310, an AND gate 320, OR gates 330, 340 and 350, latches 360 and 370, and OR gates 380 and 390. As connections and operations of the inverter 310, the AND gate 320, and the OR gates 330, 340 and 350 are similar to that of the inverter 210, the AND gate 220, and the OR gates 230, 240 and 250, respectively, related details are not repeated here for brevity. Furthermore, connections and operations of the latches 360 and 370 are similar to that of the latches 260 and 270, where the difference is that the latch 360 may latch data output from the OR gate 340 according to timing of the clock signal received by the input terminal CK to output an inverted version of this data (which is illustrated by a circle depicted on the latch 360 in FIG. 3), and the latch 370 may latch data output from the OR gate 350 according to the timing of the clock signal received by the input terminal CK to output an inverted version of this data (which is illustrated by a circle depicted on the latch 370 in FIG. 3). In addition, two input terminals of the OR gate are respectively coupled to a data input terminal of the latch 360 and the input terminal CK of the combo clock gated circuit 300, and an output terminal of the OR gate 380 is coupled to the output terminal GCKP of the combo clock gated circuit 300. Thus, the OR gate 380 may perform an OR logic operation upon the clock signal received by the input terminal CK of the combo clock gated circuit 300 (e.g. the system clock CLK, the secondary clock CLKS1 or the secondary clock CLKS2) and a derivative signal of the primary clock control signal (e.g. a signal generated by the OR gate 340 and the latch 360 performing logic operations upon the primary clock control signal output from the AND gate 320) to generate the at least one primary clock. Two input terminals of the OR gate 390 are respectively coupled to a data input terminal of the latch 370 and the input terminal CK of the combo clock gated circuit 300, and an output terminal of the OR gate 390 is coupled to the output terminal GCKS of the combo clock gated circuit 300. Thus, the OR gate 390 may perform an OR logic operation upon the clock signal received by the input terminal CK of the combo clock gated circuit 300 (e.g. the system clock CLK, the secondary clock CLKS1 or the secondary clock CLKS2) and a derivative signal of the secondary clock control signal (e.g. a signal generated by the OR gate 350 and the latch 370 performing logic operations upon the secondary clock control signal output from the AND gate 330) to generate the at least one secondary clock.

Figure 4:
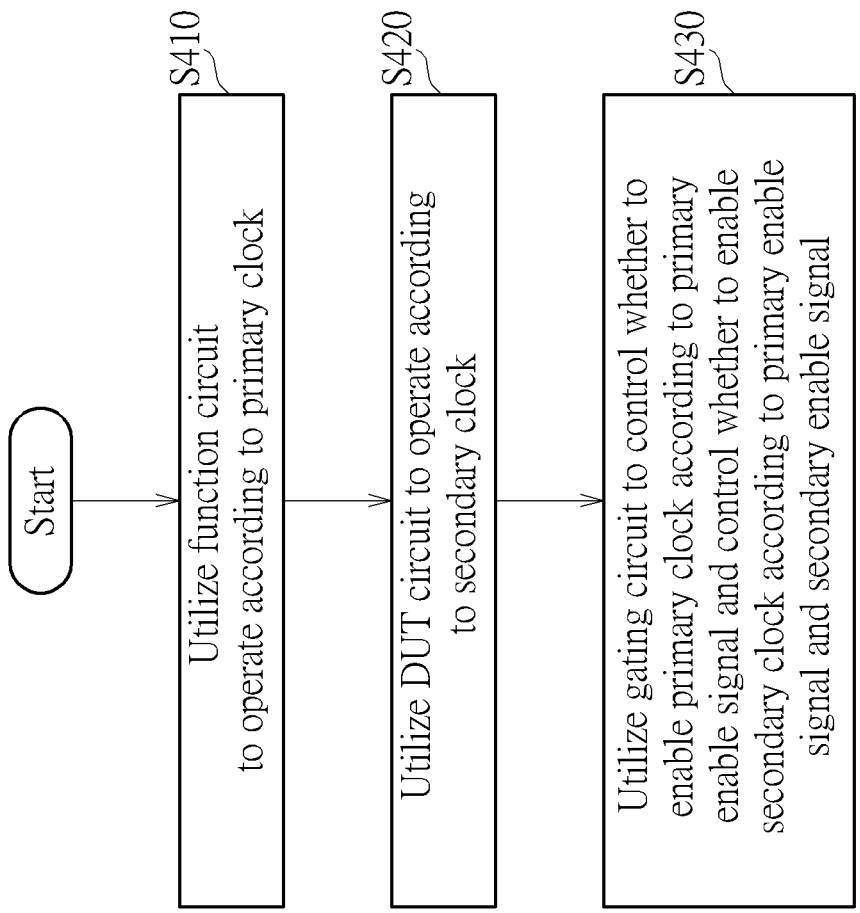
FIG. 4 is a diagram illustrating a working flow of a method for performing clock gating in an electronic device according to an embodiment of the present invention.

FIG. 4 is a diagram illustrating a working flow of a method for performing clock gating in the electronic device 10 according to an embodiment of the present invention. It should be noted that the working flow shown in FIG. 4 is for illustrative purposes only, and is not meant to be a limitation of the present invention. For example, one or more steps may be added, deleted or modified in the working flow shown in FIG. 4. In addition, if an overall result is not affected, these steps do not have to be executed in the exact order shown in FIG. 4.

In Step S410, the electronic device 10 may utilize at least one function circuit (e.g. the function circuit 120, 130 or 140) to operate according to at least one primary clock (e.g. the primary clock CLKP1, CLKP2 or CLKP3).

In Step S420, the electronic device 10 may utilize the DUT circuit 100 to operate according to at least one secondary clock (e.g. the secondary clock CLKS3).

In Step S430, the electronic device 10 may utilize at least one gating circuit (e.g. the combo clock gated circuit CCG1, CCG2 or CCG3) to control whether to enable the at least one primary clock according to at least one primary enable signal (e.g. the primary enable signals EN1, EN2 or EN3) and control whether to enable the at least one secondary clock (e.g. the secondary clocks CLKS1, CKS2 or CLKS3) according to the at least one primary enable signal and the secondary enable signal $TE_{DUT}$.

To summarize, the electronic device 10 provided by the embodiments of the present invention can utilize a combo clock gated circuit to control enablement states of the primary clocks CLKP1 to CLKP3 and the secondary clocks CLKS1 to CLKS3 in response to the states of the primary enable signals EN1 to EN3 and the secondary enable signal $TE_{DUT}$. More particularly, when the primary clocks CLKP1 to CLKP3 are disabled, the secondary clocks CLKS1 to CLKS3 still can be maintained at enabled states in response to the testing requirement. Thus, when the power saving mode of the electronic device 10 is turned on (i.e. the primary clocks CLKP1 to CLKP3 are disabled to stop the operations of the function circuits 120 to 140), the secondary clocks still can be maintained at the enabled states, to allow the DUT circuit 100 to be able to operate under a condition where the power saving mode of the electronic device 10 is turned on. Furthermore, the embodiments of the present invention will not greatly increase additional costs. Thus, the present invention can solve the problems of the related art without introducing any side effect or in a way that is less likely to introduce side effects.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
   at least one function circuit, configured to operate according to at least one primary clock, wherein the at least one function circuit comprises a first function circuit and a second function circuit, and the first function circuit and the second function circuit operate according to a first primary clock and a second primary clock, respectively;
   a device under test (DUT) circuit, configured to operate according to at least one secondary clock; and
   at least one gating circuit, configured to control whether to enable the at least one primary clock according to at least one primary enable signal, and control whether to enable the at least one secondary clock according to the at least one primary enable signal and a secondary enable signal, wherein the at least one gating circuit comprises a first gating circuit and a second gating circuit, the first gating circuit controls whether to enable the first primary clock according to a first primary enable signal and controls whether to enable a first secondary clock according to the first primary enable signal and the secondary enable signal, and the second gating circuit controls whether to enable the second primary clock according to a second primary enable signal and controls whether to enable a second secondary clock according to the second primary enable signal and the secondary enable signal;
   wherein the second gating circuit receives the second primary enable signal from the first function circuit and receives the first secondary clock from the first gating circuit, in order to perform gating upon the first secondary clock to output the second primary clock and the second secondary clock, and the DUT circuit operates according to the second secondary clock.

2. The electronic device of claim 1, wherein when the at least one primary enable signal indicates that a power saving mode of the electronic device is turned off, the at least one gating circuit enables the at least one primary clock and the at least one secondary clock.

3. The electronic device of claim 1, wherein when the at least one primary enable signal indicates that a power saving mode of the electronic device is turned on, the at least one gating circuit disables the at least one primary clock to stop an operation of the at least one function circuit.

4. The electronic device of claim 1, wherein when the at least one primary enable signal indicates that a power saving mode of the electronic device is turned on and a test mode of the DUT circuit is turned on, the at least one gating circuit disables the at least one primary clock to stop an operation of the at least one function circuit, and enables the at least one secondary clock to maintain an operation of the DUT circuit under a condition where the power saving mode of the electronic device is turned on.

5. The electronic device of claim 1, wherein the at least one gating circuit comprises:
   an inverter, configured to generate an inverted signal of the secondary enable signal;
   an AND gate, configured to perform an AND logic operation upon the at least one primary enable signal and the inverted signal of the secondary enable signal to generate a primary clock control signal, wherein the at least one primary clock is generated according to the primary clock control signal; and
   an OR gate, configured to perform an OR logic operation upon the at least one primary enable signal and the secondary enable signal to generate a secondary clock control signal, wherein the at least one secondary clock is generated according to the secondary clock control signal.

6. The electronic device of claim 5, wherein the at least one gating circuit further comprises:
   a primary output AND gate, configured to perform an AND logic operation upon a clock signal and a derivative signal of the primary clock control signal to generate the at least one primary clock; and
   a secondary output AND gate, configured to perform an AND logic operation upon the clock signal and a derivative signal of the secondary clock control signal to generate the at least one secondary clock.

7. The electronic device of claim 5, wherein the at least one gating circuit further comprises:
a primary output OR gate, configured to perform an OR logic operation upon a clock signal and a derivative signal of the primary clock control signal to generate the at least one primary clock; and
a secondary output OR gate, configured to perform an OR logic operation upon the clock signal and a derivative signal of the secondary clock control signal to generate the at least one secondary clock.

8. A method for performing clock gating in an electronic device, comprising:
utilizing at least one function circuit of the electronic device to operate according to at least one primary clock, the at least one function circuit comprises a first function circuit and a second function circuit;
utilizing a device under test (DUT) circuit of the electronic device to operate according to at least one secondary clock; and
utilizing at least one gating circuit of the electronic device to control whether to enable the at least one primary clock according to at least one primary enable signal and control whether to enable the at least one secondary clock according to the at least one primary enable signal and a secondary enable signal, wherein the at least one gating circuit comprises a first gating circuit and a second gating circuit, and the method comprises:
utilizing the first function circuit and the second function circuit to operate according to a first primary clock and a second primary clock, respectively;
utilizing the first gating circuit to control whether to enable the first primary clock according to a first primary enable signal, and controlling whether to enable a first secondary clock according to the first primary enable signal and the secondary enable signal; and
utilizing the second gating circuit to control whether to enable the second primary clock according to a second primary enable signal, and controlling whether to enable a second secondary clock according to the second primary enable signal and the secondary enable signal;
wherein the second gating circuit receives the second primary enable signal from the first function circuit and receives the first secondary clock from the first gating circuit, in order to perform gating upon the first secondary clock to output the second primary clock and the second secondary clock, and the DUT circuit operates according to the second secondary clock.

9. The method of claim 8, wherein utilizing the at least one gating circuit of the electronic device to control whether to enable the at least one primary clock according to the at least one primary enable signal and control whether to enable the at least one secondary clock according to the at least one primary enable signal and the secondary enable signal comprises:
in response to the at least one primary enable signal indicating that a power saving mode of the electronic device is turned off, utilizing the at least one gating circuit to enable the at least one primary clock and the at least one secondary clock.

10. The method of claim 8, wherein utilizing the at least one gating circuit of the electronic device to control whether to enable the at least one primary clock according to the at least one primary enable signal and control whether to enable the at least one secondary clock according to the at least one primary enable signal and the secondary enable signal comprises:
in response to the at least one primary enable signal indicating that a power saving mode of the electronic device is turned on, utilizing the at least one gating circuit to disable the at least one primary clock to stop an operation of the at least one function circuit.

11. The method of claim 8, wherein utilizing the at least one gating circuit of the electronic device to control whether to enable the at least one primary clock according to the at least one primary enable signal and control whether to enable the at least one secondary clock according to the at least one primary enable signal and the secondary enable signal comprises:
in response to the at least one primary enable signal indicating that a power saving mode of the electronic device is turned on and a test mode of the DUT circuit is turned on, utilizing the at least one gating circuit to disable the at least one primary clock to stop an operation of the at least one function circuit and enable the at least one secondary clock to maintain an operation of the DUT circuit under a condition where the power saving mode of the electronic device is turned on.

12. The method of claim 8, wherein utilizing the at least one gating circuit of the electronic device to control whether to enable the at least one primary clock according to the at least one primary enable signal and control whether to enable the at least one secondary clock according to the at least one primary enable signal and the secondary enable signal comprises:
utilizing an inverter of the at least one gating circuit to generate an inverted signal of the secondary enable signal;
utilizing an AND gate of the at least one gating circuit to perform an AND logic operation upon the at least one primary enable signal and the inverted signal of the secondary enable signal to generate a primary clock control signal, wherein the at least one primary clock is generated according to the primary clock control signal; and
utilizing an OR gate of the at least one gating circuit to perform an OR logic operation upon the at least one primary enable signal and the secondary enable signal to generate a secondary clock control signal, wherein the at least one secondary clock is generated according to the secondary clock control signal.

13. The method of claim 12, wherein utilizing the at least one gating circuit of the electronic device to control whether to enable the at least one primary clock according to the at least one primary enable signal and control whether to enable the at least one secondary clock according to the at least one primary enable signal and the secondary enable signal further comprises:
utilizing a primary output AND gate of the at least one gating circuit to perform an AND logic operation upon a clock signal and a derivative signal of the primary clock control signal to generate the at least one primary clock; and
utilizing a secondary output AND gate of the at least one gating circuit to perform an AND logic operation upon the clock signal and a derivative signal of the secondary clock control signal to generate the at least one secondary clock.

14. The method of claim 12, wherein utilizing the at least one gating circuit of the electronic device to control whether to enable the at least one primary clock according to the at least one primary enable signal and control whether to enable the at least one secondary clock according to the at least one primary enable signal and the secondary enable signal further comprises:
- utilizing a primary output OR gate of the at least one gating circuit to perform an OR logic operation upon a clock signal and a derivative signal of the primary clock control signal to generate the at least one primary clock; and
- utilizing a secondary output OR gate of the at least one gating circuit to perform an OR logic operation upon the clock signal and a derivative signal of the secondary clock control signal to generate the at least one secondary clock.

* * * * *